United States Patent [19]

Suzuki

[11] Patent Number: 5,777,438
[45] Date of Patent: Jul. 7, 1998

[54] APPARATUS FOR IMPLANTING METAL IONS IN METALS AND CERAMICS

[75] Inventor: Yasuo Suzuki, Kyoto, Japan

[73] Assignee: Nissin Electric Co., Ltd., Kyoto, Japan

[21] Appl. No.: 600,524

[22] Filed: Feb. 13, 1996

[30] Foreign Application Priority Data

Feb. 15, 1995 [JP] Japan ..................... 7-051896

[51] Int. Cl.$^6$ ............................... H05B 37/02
[52] U.S. Cl. .................... 315/111.81; 315/111.21
[58] Field of Search ............ 204/198.38; 118/723 R, 118/723 VE; 315/111.81, 111.21

[56] References Cited

U.S. PATENT DOCUMENTS

| | | | |
|---|---|---|---|
| 5,008,585 | 4/1991 | Bernardt et al. | 315/111.81 |
| 5,061,684 | 10/1991 | Freller et al. | 545/1 |
| 5,126,163 | 6/1992 | Chan | 427/38 |

FOREIGN PATENT DOCUMENTS

SHO 63-458  1/1988  Japan.
HEI 3-79153  8/1991  Japan.

*Primary Examiner*—Robert Pascal
*Assistant Examiner*—Michael Shingleton
*Attorney, Agent, or Firm*—Finnegan, Henderson, Farabow, Garrett & Dunner, L.L.P.

[57] ABSTRACT

A metal ion implanting apparatus according to the present invention includes a vacuum vessel also serving as an anode, a holder for holding a substrate to be processed, a plurality of arc evaporation sources, a plurality of arc power supplies and a bias power supply. Each of the plurality of arc evaporation sources has a cathode including at least one of metal and a metal compound. The cathode evaporates cathode substance by arc discharge between the cathodes and the vacuum vessel also serving as the anode. Each of the plurality of arc power supplies supply an arc discharge voltage between the cathode of the arc evaporation source corresponding to the arc power supply and the vacuum vessel with the cathode as a negative side. The bias power supply for applying a negative pulse-like bias voltage on a base of a potential of the vacuum vessel to the holder and the substrate held by the holder.

14 Claims, 6 Drawing Sheets

APPARATUS FOR IMPLANTING METAL IONS IN METALS AND CERAMICS

BACKGROUND OF THE INVENTION

1. Field of the Invention

This invention relates to a metal ion implanting apparatus for implanting metal ions into substrates of automobile parts such as crankshafts, general industrial parts such as drills, etc., and medical materials of artificial bones, catheters, etc., for example.

2. Description of the Related Art

The substrates of automobile parts, general industrial parts, medical materials, etc., as mentioned above usually have a complicated shape. An attempt has been made to improve the wear resistance, corrosion resistance, hardness, lubricating ability, etc., of such substrates by implanting metal ions into the substrates. For example, titanium is implanted into parts such as crankshafts to improve the wear resistance. Silver is implanted into catheters to improve the antibacterial effect. If titanium is implanted into artificial bones, the wear resistance is improved; if calcium is implanted into artificial bones, they becomes easily integral with live bones.

Various systems for coating substrates with a metal thin film rather than implanting metal ions into substrates have been proposed. FIG. 7 shows an example of them.

The thin-film formation system shown in the figure is similar to a system disclosed in Unexamined Japanese Patent Publication (kokai) No. Sho 63-458. It has a vacuum vessel 2 evacuated by an evacuator (not shown), a holder 12 located in the vacuum vessel 2 for holding a substrate 10 to be processed, and an arc evaporation source 16 attached to the vacuum vessel 2 so as to face the substrate 10. Gas 4 such as inert gas or reactive gas is introduced into the vacuum vessel 2 from a gas source (not shown).

The arc evaporation source 16, which has a cathode 18 made of metal or a metal alloy, is provided for locally dissolving the cathode 18 by arc discharge between the cathode 18 and the vacuum vessel 2 also serving as an anode for evaporating cathode substance 18a. From a DC arc power supply 20, a DC arc discharge voltage is supplied between the cathode 18 and the vacuum vessel 2 with the former as a negative side. The arc discharge voltage is about 10 V to 100 V, for example. A trigger electrode, etc., is not shown in the drawing. Numeral 17 represents an insulator and numeral 19 represents a metal flange.

A negative DC bias voltage on a base of the potential of the vacuum vessel 2 is applied to the holder 12 and the substrate 10 held by the holder 12 from a DC bias power supply 14. The bias voltage is about 0 V to 6 kV, for example.

In film formation, the vacuum vessel 2 is exhausted to about $10^{-6}$ Torr, for example, then the gas 4 is introduced into the vacuum vessel 2 and with bias voltage (as mentioned above) applied to the substrate 10, arc discharge is performed at the arc evaporation source 16, whereby the cathode substance 18a is evaporated from the cathode 18. Plasma (not shown) is generated near the front of the cathode 18 by the arc discharge and a part of the cathode substance 18a is ionized. The ionized cathode substance 18a is attracted to the substrate 10 to which the negative bias voltage is applied, and is incident and deposited on the substrate 10 for forming a thin film made of the cathode substance 18a on the surface of the substrate 10. If the gas 4 is a reactive gas, a compound thin film of the cathode substance 18a and the reactive gas is formed. Such a film formation method is a kind of ion plating.

The thin-film formation system as described above cannot implant metal ions into the substrate 10 although it coats the surface of the substrate 10 with a metal thin film. The reason is as follows: To implant metal ions into the substrate 10, a bias voltage far larger than the abovementioned bias voltage, for example, a bias voltage of about 5 kV to 600 kV must be applied to the substrate 10 and metal ions must be accelerated toward the substrate at a large voltage. If an atmosphere in which the degree of vacuum is about $10^{-4}$ Torr is taken as an example, ideally (namely, when voltage is applied between electrodes with no foreign material such as bulk particles in an equal electric field), a bias voltage of up to 60 kV can be applied according to Paschen's law. However, in the system, one is the plasma electrode formed near the front of the cathode 18 and the other is the electrode formed of the substrate 10 normally having asperities, thus an unequal electric field occurs. Since foreign material (bulk cathode substance 18a) is contained between the electrodes, actually a breakdown occurs between the plasma electrode and the substrate 10 at less than 10 kV, stopping the bias power supply 14. From this reason, it is difficult to apply a large DC bias voltage to the substrate 10 and therefore, such a system cannot implant metal ions into the substrate 10.

To implant metal ions into substrates, normally a metal ion source is used. FIG. 8 shows an example of such a metal ion source.

The metal ion source is similar to that disclosed in Unexamined Japanese Utility Model Public (jikkai) No. Hei 3-79153, for example. Metal vapor 26 generated by heating metal in an oven 24 is supplied to a plasma generation vessel 22, where the metal vapor 26 is converted into plasma to generate metal plasma 28 from which metal ions 32 are extracted by applying voltage to extraction electrodes 30, which consist of several electrodes each having a large number of holes 31.

According to such a metal ion source, a voltage of about 1 kV to 100 kV can be applied to the extraction electrodes 30 for extracting metal ions 32 of energy of about 1 keV to 100 keV, and the metal ions 32 can be applied to a substrate for metal ion implantation.

However, as the metal ions 32 are extracted from the extraction electrodes 30, metal adheres to the electrodes and the holes 31 are clogged with the metal, making it difficult to extract the metal ions 32. Thus, the extraction electrodes 30 must be cleaned frequently; maintenance is not easy. Continuous operation for long time is hard to perform.

Moreover, since the metal ions 32 extracted from the extraction electrodes 30 travel in straight lines and are strong in directivity, it is difficult to uniformly implant metal ions into a substrate of a complicated shape. To do this, more than one metal ion source as described above must be used. In doing so, the ion sources themselves are expensive and more than one power supply for each of them is required, leading to extremely high costs.

SUMMARY OF THE INVENTION

It is therefore a main object of the invention to provide a metal ion implanting apparatus which can implant metal ions uniformly into even complicated-shaped substances, continuously operate for long time, is easily maintained, and is inexpensive.

A metal ion implanting apparatus according to the present invention is comprised of: a vacuum vessel also serving as an anode; a holder being disposed in the vacuum vessel for holding a substrate to be processed; a plurality of arc evaporation sources being attached to the vacuum vessel to surround the substrate held by the holder in the vacuum vessel, each of the plurality of arc evaporation sources having a cathode comprising at least one of metal and a metal compound, the cathode evaporating cathode substance by arc discharge between the cathodes and the vacuum vessel also serving as the anode; a plurality of arc power supplies each for supplying an arc discharge voltage between the cathode of the arc evaporation source corresponding to the arc power supply and the vacuum vessel with the cathode as a negative side; and a bias power supply for applying a negative pulse-like bias voltage on a base of a potential of the vacuum vessel to the holder and the substrate held by the holder.

According to the configuration, if the arc discharge voltage is supplied from each arc power supply to each arc evaporation source for causing arc discharge to occur in each arc evaporation source, the metal plasma containing the cathode substance is generated near each cathode. In the state, if the negative pulse-like bias voltage is applied to the holder and the substrate held by the holder from the bias power supply, it causes the metal ions to be extracted from the metal plasma and drawn into the substrate.

In this case, if the bias voltage is DC, a breakdown easily occurs for the reason as described above, thus the bias voltage cannot be set very large. If the bias voltage is a pulse-like bias voltage, the pulse width of the voltage can be selected appropriately for causing the voltage to reach 0 or near 0 before a breakdown occurs. Therefore, a large negative bias voltage can be applied to the substrate. Resultantly, the metal ions can be extracted at a large voltage from the metal plasma generated by each arc evaporation source and can be implanted into the substrate. In this case, a plurality of the arc evaporation sources are placed so as to surround the substrate held by the holder and moreover the metal plasma generated by each arc evaporation source spreads out into the nearby space, so that the metal ions can be implanted into the substrate from the surroundings thereof, whereby the metal ions can be uniformly implanted into even complicated-shaped substrates.

Moreover, since the metal ions in the metal plasma are directly extracted due to the effect of the negative bias voltage, extraction electrodes involved in a metal ion source are not required and the problem of clogging the holes of the extraction electrodes with metal does not occur. Therefore, continuous operation can be performed for long time and maintenance is also easy, leading to extremely high productivity.

Unlike the metal ion source, the arc evaporation source does not require the extraction electrodes or power supplies therefor and is simple in structure. Thus, the cost of disposing a plurality of the arc evaporation sources is far lower than that of disposing a plurality of the metal ion sources.

DETAILED DESCRIPTION OF THE INVENTION

Referring now to the accompanying drawings, a detailed description of the invention will be described as follows.

Figure 1:
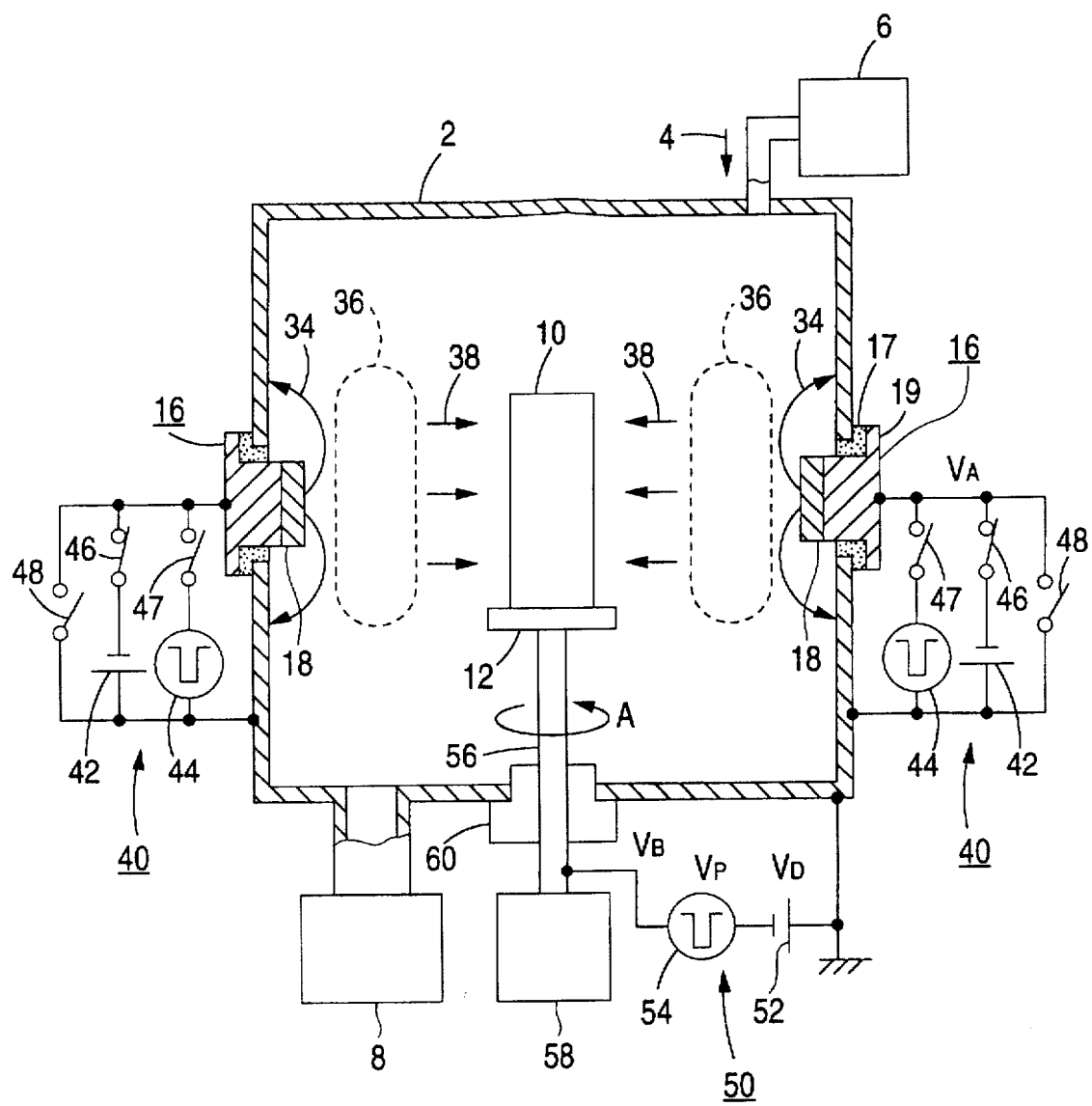
FIG. 1 is a longitudinal sectional view showing one embodiment of a metal ion implanting apparatus according to the invention.

FIG. 1 is a longitudinal sectional view showing a metal ion implanting apparatus according to the present invention.

Figure 2:
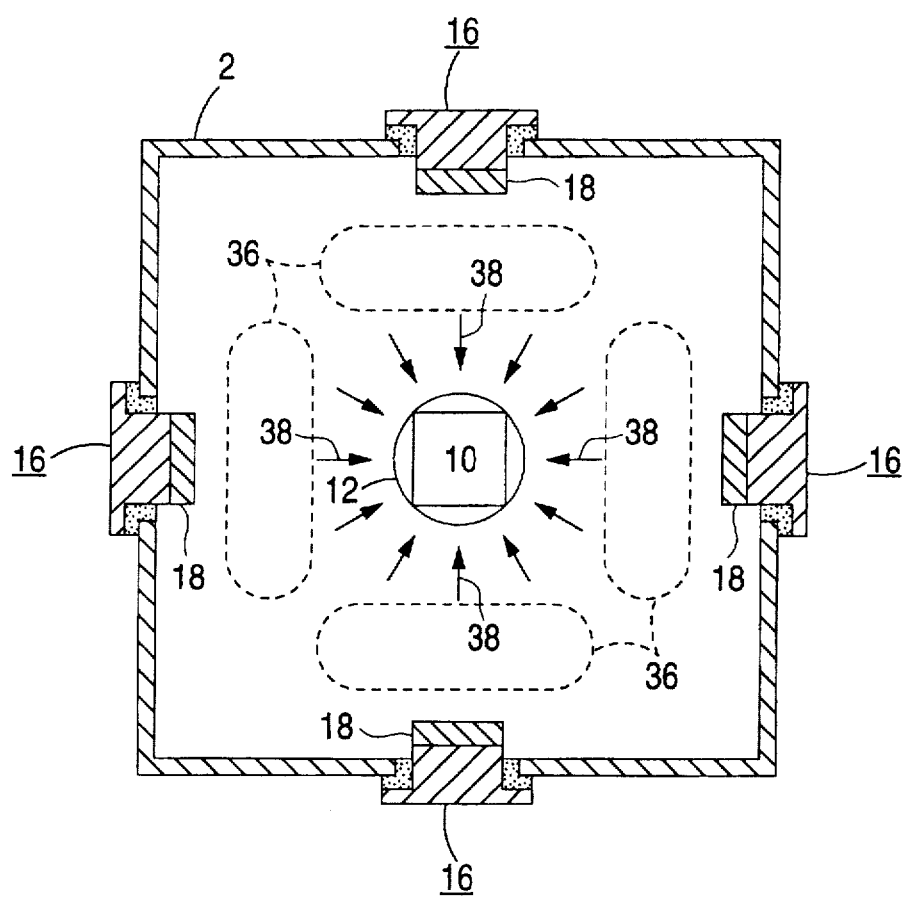
FIG. 2 is a transverse sectional view of the implanting apparatus in FIG. 1.

FIG. 2 is a transverse sectional view of the implanting apparatus in FIG. 1.

The metal ion implanting apparatus of the present invention has a vacuum vessel 2 evacuated by an evacuator 8. Gas 4 such as an inert gas or reactive gas is introduced into the vacuum vessel 2 from a gas source 6. The inert gas is an argon gas, for example. The reactive gas is a gas reacting with evaporation substance ionized when a cathode 18 of an arc evaporation source 16 described below is arc-evaporated to yield a compound. For example, to yield nitride, it is a nitrogen gas; to yield carbide, it is a methane gas, ethylene gas, or the like.

A holder 12 for holding a substrate 10 to be processed is located in the vacuum vessel 2. The shape of the holder 12 is not limited to the shape shown and may be of any shape if it can hold the substrate 10.

Preferably, the holder 12 is made rotational so that ions can be implanted more uniformly into the full face of the substrate. For this purpose, the holder 12 is supported by a rotating shaft 56 and the holder 12 and the substrate 10 are rotated, for example, in the arrow A direction by a rotation drive 58 disposed outside the vacuum vessel 2. A bearing part 60 having functions of vacuum sealing and electrically insulating between the rotating shaft 56 and the vacuum vessel 2 is located in the portion where the rotating shaft 56 penetrates the vacuum vessel 2.

The substrate 10 is, for example, an automobile part such as a crankshaft, a general industrial part of a drill, etc., a medical material of an artificial bone, catheter, or the like, as described above; its shape is not limited to that shown and may be any shape.

If the substrate 10 is nonconductive, preferably the surface of the substrate 10 is coated with a conductive thin film of metal, etc., or conductive material of metal, etc., is introduced into the inside of the substrate 10 before ion implantation so that a bias voltage can be applied to the substrate 10 from the holder 12.

A plurality of arc evaporation sources 16 are attached to the vacuum vessel 2 so as to surround the substrate 10 held by the internal holder 12. More specifically, as shown in FIG. 2, the plane shape of the vacuum vessel 2 is square and the arc evaporation sources 16 are attached to the four side faces of the vacuum vessel 2 so as to surround the substrate 10 held by the holder 12 from all directions. The arc evaporation source 16 may also be disposed on the top face of the vacuum vessel 2 toward the substrate 10.

Each arc evaporation source 16, which has a cathode 18 made of metal or a metal alloy, is provided for locally dissolving the cathode 18 by causing arc discharge (numeral 34 in FIG. 1 shows the arc schematically) between the cathode 18 and the vacuum vessel 2 also serving as an anode for evaporating cathode substance. At the time, metal plasma 36 containing the cathode substance is generated near the front of each cathode 18 by the arc discharge.

Normally, each arc evaporation source 16 is provided with a trigger electrode, etc., for starting arc discharge, for example, as disclosed in Unexamined Japanese Patent Publication (kokai) No. Sho 63-18056, but is not shown in the drawing. Numeral 17 designates an insulator and numeral 19 represents a metal flange in the drawing.

An arc power supply 40 for supplying arc discharge voltage $V_A$ between the cathode 18 of each arc evaporation source 16 and the vacuum vessel 2 with the cathode 18 as the negative side is connected therebetween.

In order to enable various types of processing as described below, each arc power supply 40 is provided with a DC arc power supply 42 for supplying a DC arc discharge voltage between the cathode 18 and the vacuum vessel 2 with the former as the negative side and a pulse arc power supply 44 for supplying a negative pulse-like arc discharge voltage between the cathode 18 and the vacuum vessel 2, whereby the DC arc discharge voltage and pulse-like arc discharge voltage can be alternatively switched for supply to each cathode 18. For this purpose, the arc power supplies 42 and 44 are alternatively connected to the cathode 18 by switches 46 and 47, but the circuit configuration is not limited to it.

Further, in order to enable various types of processing as described below, a plurality of switches 48 are provided each for opening/closing the path between the cathode 18 of each arc evaporation source 16 and the vacuum vessel 2.

A bias power supply 50 for applying a negative pulse-like bias voltage $V_B$ on a base of the potential of the vacuum vessel 2 (this potential normally is ground potential) to the holder 12 and the substrate 10 held by the holder 12 is connected to the holder 12 via the rotating shaft 56 in the example. However, with the rotating shaft 56 as an insulator, the bias voltage $V_B$ may be applied to the holder 12 via a lead, etc., other than the rotating shaft 56.

In order to enable various types of processing as described below, the bias power supply 50 includes a DC bias power supply 52 for outputting a negative DC bias voltage $V_D$ and a pulse bias power supply 54 for superposing a negative pulse bias voltage $V_P$ on the negative DC bias voltage $V_D$. A switch (not shown) may be connected to the DC bias power supply 52 for bypassing the power supply 52 when the power supply 52 is not used.

The basic operation of the metal ion implanting apparatus as described above will be described. The cathode 18 made of desired metal, such as titanium or silver, is attached to each arc evaporation source 16 and a desired substrate 10 is held by the holder 12. In this state, the vacuum vessel 2 is exhausted to a predetermined vacuum degree, for example, about $10^{-5}$ to $10^{-6}$ Torr, by the evacuator 8. Then, gas 4 is introduced into the vacuum vessel 2 from the gas source 6 as required. For example, to cause cathode substance to react with the gas 4 to yield a compound, a reactive gas such as a nitrogen gas, methane gas, or ethylene gas is introduced into the vacuum vessel 2 so that the vacuum degree in the vacuum vessel 2 becomes about $10^{-2}$ to $10^{-3}$ Torr, for example. If such a compound is not produced, preferably an inert gas of argon, etc., is introduced into the vacuum vessel 2 so that the vacuum degree in the vacuum vessel 2 becomes about $10^{-3}$ to $10^{-4}$ Torr, for example, to cause arc discharge to stably occur in each arc evaporation source 16.

In such a state, if the arc discharge voltage $V_A$ is supplied from each arc power supply 40 to each arc evaporation source 16 for causing arc discharge to occur in each arc evaporation source 16, the metal plasma 36 containing the cathode substance is generated near the front of each cathode 18.

In the state, if the negative pulse-like bias voltage $V_B$ is applied to the holder 12 and the substrate 10 held by the holder 12 from the bias power supply 50, it causes the metal ions 38 to be extracted from the metal plasma 36 and drawn into the substrate 10.

In this case, if the bias voltage is DC, a breakdown easily occurs between the holder 12 and/or the substrate 10 and the vacuum vessel 2 via the plasma for the reason as described above, thus the bias voltage cannot be increased exceeding a certain degree. If the bias voltage is the pulse-like bias voltage $V_B$, the pulse width of the voltage can be selected appropriately for causing the voltage to reach 0 or near 0 before a breakdown occurs. That is, the metal plasma 36 contains metallic masses called droplets. It is assumed that the time to a breakdown caused by the droplets is t and the pulse width of the bias voltage $V_B$ is W (see FIGS. 3 and 4). If the condition of W<t is satisfied, the voltage disappears before the breakdown is caused to occur, thus the breakdown can be prevented. Therefore, a large bias voltage can be applied to the substrate 10.

If the pulse width W of the pulse-like bias voltage $V_B$ is made shorter, the chance of causing a breakdown is made smaller while the power that can be supplied is made smaller. If the pulse width W is widened, a breakdown is easily caused to occur although it depends on the pressure in the vacuum vessel 2, the shape of the substrate 10, etc. Considering these factors, preferably the pulse width W is selected in the range of 1 µs to 10 ms.

Because of pulse-like voltage, to supply large power, preferably the frequency (number of repetitions) of the bias voltage $V_B$ is heightened to a certain degree or more, specifically 100 Hz to 10 kHz.

Under such conditions, the bias voltage $V_B$ whose absolute value is about 1 kV to 700 kV can be applied to the holder 12 and the substrate 10.

A typical example of the bias voltage $V_B$ in the range is as follows: The magnitude is −30 kV to −125 kV, the pulse width is 10 to 30 µs, and the frequency is 200 Hz to 2 kHz.

Thus, the metal ion implanting apparatus can extract the metal ions 38 at a large voltage from the metal plasma 36 generated by each arc evaporation source 16 and implant the metal ions 38 into the substrate 10.

In this case, a plurality of the arc evaporation sources 16 are placed so as to surround the substrate 10 held by the holder 12, and moreover the metal plasma 36 generated by each arc evaporation source 16 spreads out into the nearby space. Accordingly, the metal ions 38 can be implanted into the substrate 10 from the surroundings thereof. Therefore, the metal ions can be uniformly implanted into even complicated-shaped substrates 10.

Moreover, since the metal ions 38 in the metal plasma 36 are directly extracted due to the effect of the bias voltage $V_B$, the extraction electrodes involved in the metal ion source described above are not required and the problem of clogging the holes of the extraction electrodes with metal does not occur. Therefore, continuous operation can be performed for long time and maintenance is also easy, leading to extremely high productivity.

Unlike the metal ion source, the arc evaporation source 16 does not require the extraction electrodes or power supplies therefor and is simple in structure. Thus, the cost of disposing a plurality of the arc evaporation sources 16 is far lower than that of disposing a plurality of the metal ion sources.

Next, embodiments for performing various types of processing by using the metal ion implanting apparatus as described above will be discussed.

Embodiment 1: To execute metal ion implantation only (1)

This embodiment uses only the pulse arc power supplies 44 in the arc power supplies 40 and only the pulse bias power supply 54 in the bias power supply 50 as power is supplied. Therefore, the DC arc power supplies 42, the DC bias power supply 52, etc., are not required. Therefore, to perform only the processing in this embodiment, each arc power supply 40 may be made up of only the pulse arc power supply 44 and the bias power supply 50 may be made up of only the pulse bias power supply 54.

Figure 3:
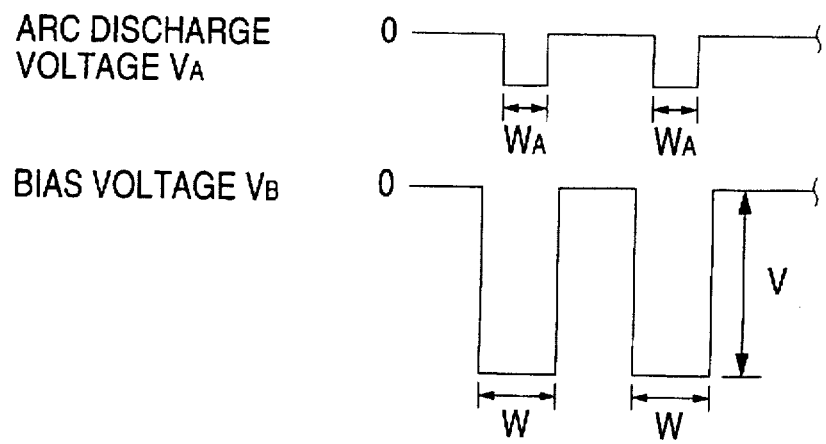
FIG. 3 is a chart showing an embodiment of waveforms of arc discharge voltage and bias voltage.

Negative pulse-like arc discharge voltage $V_A$, for example, as shown in FIG. 3 is supplied from each pulse arc power supply 44 to the cathode 18 of each arc power evaporation source 16. Negative pulse-like bias voltage $V_B$, for example, as shown in FIG. 3 is applied from the pulse bias power supply 54 to the holder 12 and the substrate 10 held by the holder 12. Moreover, both the voltages $V_A$ and $V_B$ are previously synchronized with each other and the pulse width W of the latter is previously made longer than the pulse width $W_A$ of the former. The preferred ranges of the amplitude (absolute value) V, pulse width W, and frequency of the pulse-like bias voltage $V_B$ are as described above.

In the embodiment, since the arc discharge voltage $V_A$ is like pulses, arc discharge in each arc evaporation source 16 occurs intermittently and the metal plasma 36 is also generated intermittently. Whenever the metal plasma 36 is generated, the bias voltage $V_B$ is applied to the holder 12 and the substrate 10, so that the metal ions 38 are implanted into the substrate 10 because of the effect as described above, but coating of the substrate 10 with cathode substance (metal) because of the effect of a low bias voltage or no bias voltage is not performed. Therefore, only metal ion implantation can be executed into the substrate 10.

Embodiment 2: To execute metal ion implantation only (2)

In this embodiment, only the DC arc power supplies 42 are used in the arc power supplies 40. Therefore, the pulse arc power supplies 44, the switches 48, etc., are not required. Both the DC bias power supply 52 and the pulse bias power supply 54 are used in the bias power supply 50. Therefore, to perform only the processing in this embodiment, each arc power supply 40 may be made up of only the DC arc power supply 42 and the bias power supply 50 may be made up of the DC bias power supply 52 and the pulse bias power supply 54.

Figure 4:
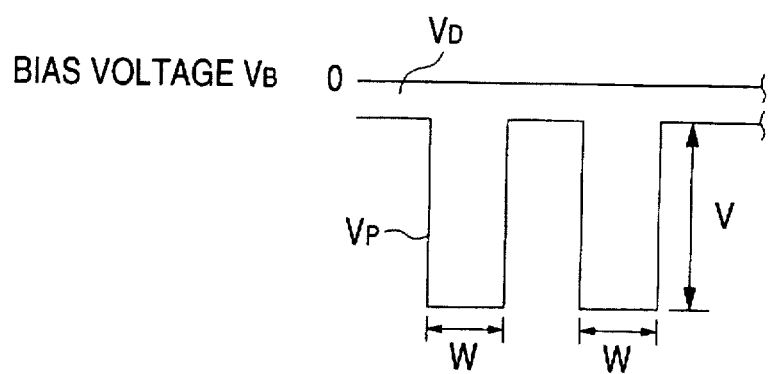
FIG. 4 is a chart showing another embodiment of a waveform of bias voltage.

DC arc discharge voltage $V_A$ is supplied from each DC arc power supply 42 to the cathode 18 of each arc power evaporation source 16. Bias voltage $V_B$ provided by superposing negative pulse bias voltage $V_P$ on negative DC bias voltage $V_D$, for example, as shown in FIG. 4 is applied from the bias power supply 50 to the holder 12 and the substrate 10 held by the holder 12.

In this embodiment, preferably the magnitude (absolute value) of the DC bias voltage $V_D$ is about 800 V to 10 kV, more preferably about 1 kV. Since the sputter efficiency is high at such voltage and is highest particularly at around 1 kV, the cathode substance evaporated onto the substance 10 is sputtered and completely removed by energy of the metal plasma 36. This method is called ion bombarding, whereby the surface of the substrate 10 can be cleaned, but the substrate 10 is not coated with the cathode substance.

The preferred ranges of the amplitude V, pulse width W, and frequency of the pulse bias voltage $V_P$ are as described above.

In this embodiment, since the arc discharge voltage $V_A$ is DC, arc discharge in each arc evaporation source 16 continues during processing and the metal plasma 36 is always generated. While the surface of the substrate 10 is being cleaned by ion bombarding caused by the DC bias voltage $V_D$ applied to the substrate 10, the metal ions 38 are implanted into the substrate 10 because of the effect of the pulse bias voltage $V_P$ applied to the substrate 10. That is, metal ion implantation is executed in a clean state in which impurities, oxide films, etc., do not adhere to the surface of the substrate 10, so that better metal ion implantation with less mixed impurities can be performed.

Embodiment 3: To execute coating with metal film and metal ion implantation alternately In this embodiment, the power supply configuration and the characteristics of arc discharge voltage $V_A$ and bias voltage $V_B$ are similar to those in Embodiment 2. Therefore, the bias voltage $V_B$ as shown in FIG. 4 is applied to the holder 12 and the substrate 10. However, preferably the magnitude of the DC bias voltage $V_D$ applied to the holder 12 and the substrate 10 is about 100 V to 1 kV to lessen sputtering caused by the metal plasma 36 for enabling the substrate 10 to be coated with cathode substance (metal).

In the embodiment, since the arc discharge voltage $V_A$ is DC, arc discharge in each arc evaporation source 16 continues during processing and the metal plasma 36 is always generated. Therefore, cathode substance evaporated from each arc evaporation source 16 is incident and deposited on the substrate 10 and the metal ions 38 are drawn in because of the effect of the DC bias voltage $V_D$; a metal thin film is thus formed on the surface of the substrate 10. This method is called ion plating. At the same time, the metal ions 38 are implanted into the substrate 10 because of the effect of the pulse bias voltage $V_P$ superposed on the DC bias voltage $V_D$ for the duration of the pulse width W (see FIG. 4) of the pulse bias voltage $V_P$. Therefore, in the embodiment, coating of the substrate with a metal thin film by the ion plating and metal ion implantation because of the effect of the pulse bias voltage $V_P$ are executed alternately.

Figure 5:
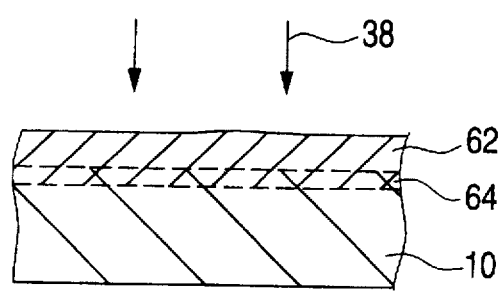
FIG. 5 is a schematic sectional view showing an embodiment of a substrate coated with a metal thin film.

According to the method, as shown in FIG. 5, the metal ions 38 can be implanted into the substrate 10 while a metal thin film 62 is being formed on the surface of the substrate 10. At this time, the metal ions 38 produce the effects of (1) excitation of evaporation atoms by energy of the ions, (2) pushing of the evaporation atoms into the substrate 10, (3) turning out the substrate atoms and evaporation atoms, and (4) the ions entering the substrate 10. The effects (2) to (4) cause a mixed layer consisting of the component elements of the substrate 10 and the metal thin film 62 to be formed in the vicinity of the interface therebetween, improving adhesion of the metal thin film 62 to the substrate 10. Also, crystallization of the metal thin film 62 is promoted by the effect (1), called ion assist.

Embodiment 4: To execute coating with compound film and metal ion implantation alternately In this embodiment, the power supply configuration, the characteristics of arc discharge voltage $V_A$ and bias voltage $V_B$, and the magnitude of DC bias voltage $V_D$ are similar to those in Embodiment 3. In the embodiment, however, a reactive gas reacting with the substance of which the cathode 18 of each arc evaporation source 16 is made to yield a compound is introduced into the vacuum vessel 2 as the gas 4.

In the embodiment, the reaction of the ionized cathode substance and the reactive gas in the atmosphere forms a compound thin film rather than a metal thin film on the surface of the substrate 10. For example, if the cathodes 18 are made of titanium and the gas 4 is a nitrogen gas, a ceramic film of titanium nitride (TiN) is formed. Coating with the compound thin film and metal ion implantation because of the effect of pulse bias voltage $V_P$ are executed alternately, whereby a compound multilayer film is formed.

Also in the method, the above-mentioned pushing, turning out, and entering effects produced by the metal ions 38 cause a mixed layer consisting of the component elements of the compound thin film and the substrate 10 to be formed in the vicinity of the interface therebetween, improving adhesion of the compound thin film to the substrate 10. Likewise, a mixed layer is formed in the vicinity between the layers of the multilayer film, improving cohesion between the layers of the multilayer film.

The cathodes 18 of the arc evaporation sources 16 may be made of different elements, in which case a multilayer film of a compound of three elements or more can be formed. For example, if the cathodes 18 are made of titanium and aluminum and a nitrogen gas is used as the gas 4, a multilayer film of a 3-element compound of (TiAl)N can be formed.

A functionally gradient film whose composition changes in the film thickness direction can also be formed by controlling the evaporation amount, etc., of the cathode substance from the cathodes 18 during the film formation.

Embodiment 5: To execute two processes of gas ion implantation and metal ion implantation This embodiment uses switches 48 for opening/closing between the cathode 16 of each arc evaporation source 16 and the vacuum vessel 2.

Figure 6:
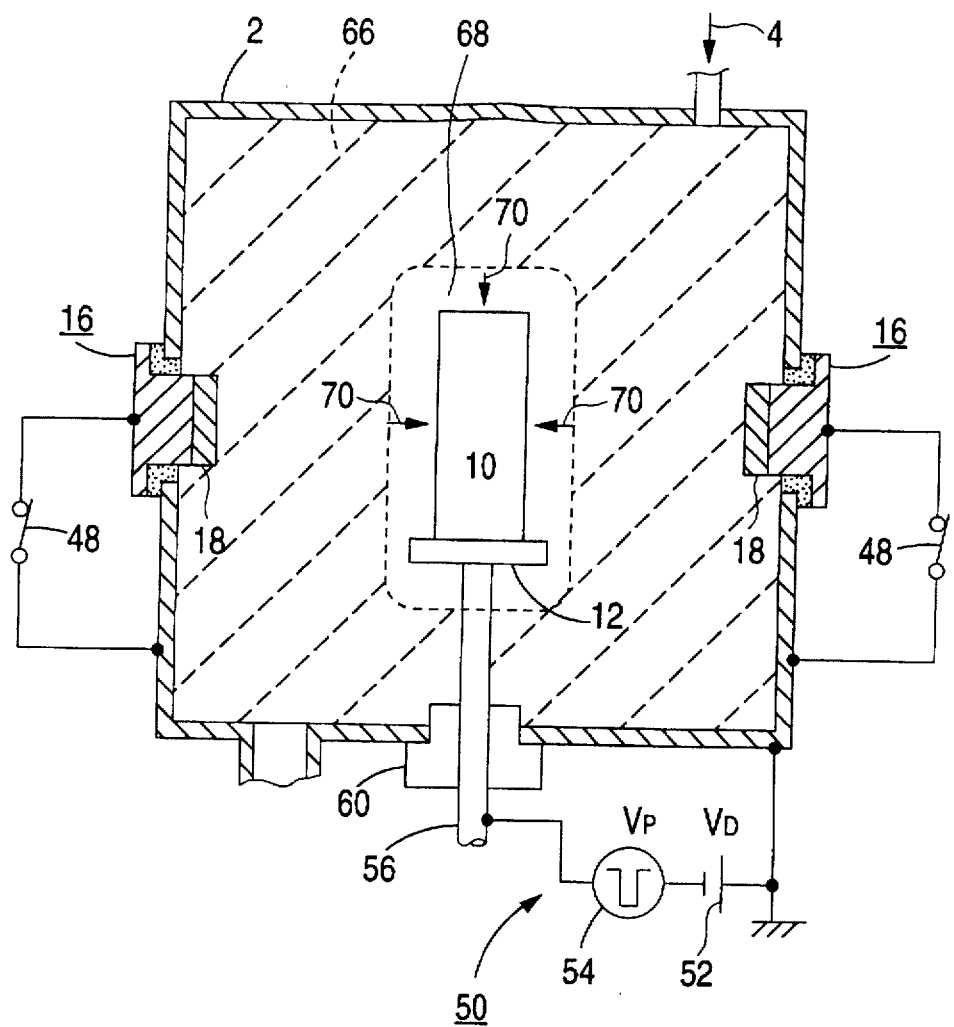
FIG. 6 is a drawing showing an embodiment of implanting gas ions into a substrate by using the implanting apparatus in FIG. 1.
Figure 7:
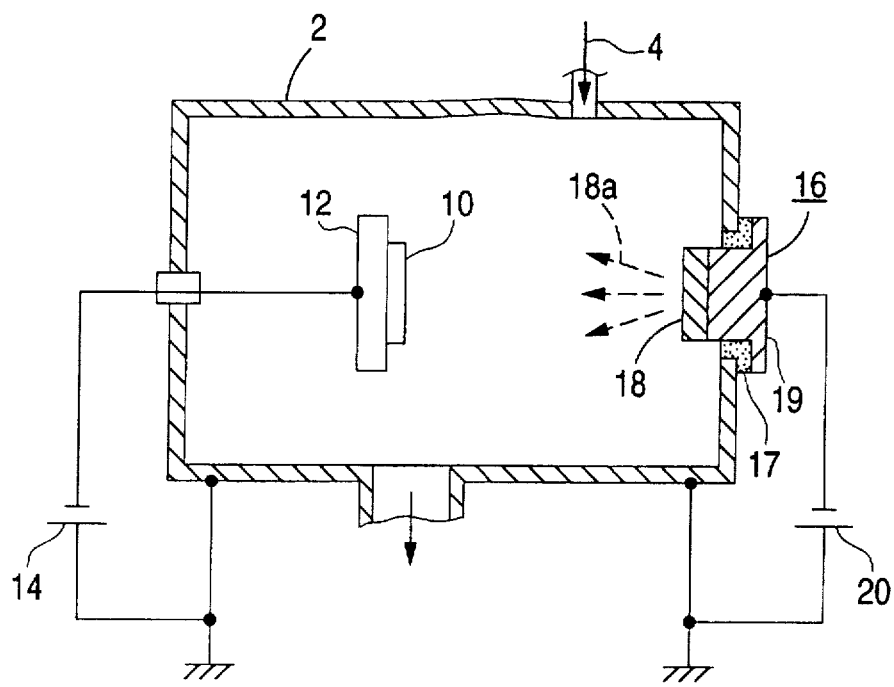
FIG. 7 is a schematic sectional view showing an embodiment of a conventional thin-film formation system using an arc evaporation source.
Figure 8:
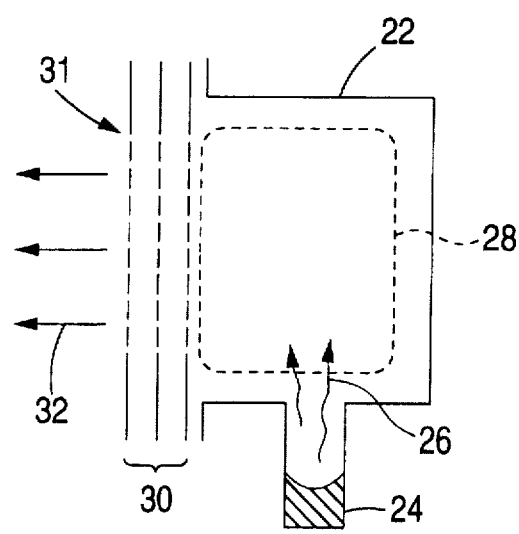
FIG. 8 is a schematic sectional view showing an embodiment of a conventional metal ion source.

In the first process, the switches 48 are closed as shown in FIG. 6. Therefore, in this state, the arc evaporation sources 16 are not worked and are simply placed in the same potential as the vacuum vessel 2. In this state, the vacuum vessel 2 is exhausted to a predetermined vacuum degree, then desired gas 4 is introduced into the vacuum vessel 2 to keep the gas pressure therein at pressure convenient for causing a DC glow discharge to occur between the substrate 10 and the vacuum vessel 2, for example, about 5 mTorr to 50 mTorr.

In the state, negative DC bias voltage $V_D$ is applied to the holder 12 and the substrate 10 held by the holder 12 from the DC bias power supply 52 forming a part of the bias power supply 50 and with the vacuum vessel 2 as an anode and the holder 12 as a cathode, a DC glow discharge is caused to occur therebetween. The magnitude of the DC bias voltage $V_D$ is set to about 500 V, for example. Then, the gas 4 introduced into the vacuum vessel 2 is ionized and gas plasma 66 is generated in the vacuum vessel 2. In this case, an ion sheath 68 mainly containing only ions with electrons excluded is formed near the holder 12 and the surface of the substrate 10 at negative potential.

In this state, when negative pulse bias voltage $V_P$ superposed on the DC bias voltage $V_D$ is applied to the holder 12 and the substrate 10 from the pulse bias power supply 54 forming a part of the bias power supply 50, the electric field causes the gas plasma 66 or gas ions 70 in the ion sheath 68 to be accelerated toward the substrate 10, whereby the gas ions can be implanted into the substrate. The first process is now complete.

In the second process, returning to the state, for example, shown in FIG. 1, the arc evaporation sources 16 are worked. That is, with the switches 48 opened, arc discharge voltage $V_A$ is supplied from the arc power supplies 40 to the arc evaporation sources 16 for operating the same to generate the metal plasma 36 and negative pulse bias voltage $V_P$ is applied to the substrate 10 from the pulse bias power supply 54 forming a part of the bias power supply 50 for drawing the metal ions 38 in the metal plasma 36 into the substrate 10 for metal ion implantation. In the second process, more specifically, the various types of processing described in Embodiments 1–4 can be performed.

Thus, the single metal ion implanting apparatus shown in FIG. 1 can perform the two processes of gas ion implantation and metal ion implantation into the substrate 10.

For example, after a nitrogen gas is introduced into the vacuum vessel 2 and nitrogen ions are implanted into the substrate 10 for performing base processing in the first process, metal ion implantation into the substrate 10 or coating the substrate 10 with a thin film and metal ion implantation into the substrate 10 can be executed as described above in the second process. That is, the base processing is nitrogen processing, whereby the surface of the substrate 10 is hardened, on which a thin film can be formed, etc., so that the substrate 10 can be coated with a thin film more excellent in the hardness, etc.

In contrast, after the second process is first executed for metal ion implantation into the substrate 10 or coating the substrate 10 with a thin film and metal ion implantation into the substrate 10, the first process can also be executed for gas ion implantation into the substrate 10, whereby gas ions can be furthermore implanted into the metal or compound thin film formed on the surface of the substrate 10 in the preceding process for forming a compound thin film of more elements apart from the metal or compound thin film. For example, nitrogen ions can also be implanted into a thin film made up of TiC, TiAl, TiZr, etc., for forming a compound thin film such as (TiC)N, (TiAl)N, (TiZr)N.

What is claimed is:

1. A metal ion implanting apparatus comprising:

a vacuum vessel also serving as an anode;

a holder being disposed in said vacuum vessel for holding a substrate to be processed;

a plurality of arc evaporation sources being attached to said vacuum vessel to surround the substrate held by said holder in said vacuum vessel, each of said plurality of arc evaporation sources having a cathode comprising at least one of metal and a metal compound, said cathode evaporating cathode substance by arc discharge between said cathodes and said vacuum vessel also serving as the anode;

a plurality of arc power supplies each for supplying an arc discharge voltage between said cathode of said arc evaporation source corresponding to said arc power supply and said vacuum vessel with said cathode as a negative side, wherein each of said arc power supplies is a DC arc power supply for outputting a DC arc discharge voltage;

a bias power supply for applying a negative pulse-like bias voltage on a base of a potential of said vacuum vessel to said holder and the substrate held by said holder, wherein said bias power supply includes a DC bias power supply for outputting a negative DC bias voltage and a pulse bias power supply for superposing a negative pulse bias voltage on the negative DC bias voltage.

2. A metal ion implanting apparatus according to claim 1, wherein the negative pulse-like bias voltage has an absolute value in the range of 1 kV to 700 kV, a pulse width ranging from 1 µs to 10 ms, and a frequency ranging from 100 Hz to 10 kHz.

3. A metal ion implanting apparatus according to claim 1 or 2, further comprising means for rotating said holder and the substrate held by said holder in said vacuum vessel.

4. A metal ion implanting apparatus according to claim 2, further comprising means for introducing into said vacuum vessel a reactive gas reacting with evaporation substance ionized when the cathodes of said arc evaporation sources are arc-evaporated.

5. A metal ion implanting apparatus according to claim 3, further comprising means for introducing into said vacuum vessel a reactive gas reacting with evaporation substance ionized when the cathodes of said arc evaporation sources are arc-evaporated.

6. A metal ion implanting apparatus comprising:

a vacuum vessel also serving as an anode;

a holder being disposed in said vacuum vessel for holding a substrate to be processed;

a plurality of arc evaporation sources being attached to said vacuum vessel to surround the substrate held by said holder in said vacuum vessel, each of said plurality of arc evaporation sources having a cathode comprising at least one of metal and a metal compound, said cathode evaporating cathode substance by arc discharge between said cathodes and said vacuum vessel also serving as the anode;

a bias power supply for applying a negative pulse-like bias voltage on a base of a potential of said vacuum vessel to said holder and the substrate held by said holder, wherein said bias power supply includes a DC bias power supply for outputting a negative DC bias voltage, and a pulse bias power supply for superposing a negative pulse bias voltage on the negative DC bias voltage;

a plurality of arc power supplies each for supplying an arc discharge voltage between said cathode of said arc evaporation source corresponding to said arc power supply and said vacuum vessel with said cathode as a negative side, wherein each of said arc power supplies includes a DC arc power supply for supplying a DC arc discharge voltage between said cathode of said arc evaporation source corresponding to said arc power supply and said vacuum vessel, and a pulse arc power supply for supplying a pulse-like arc discharge voltage being synchronized with pulse bias voltage output from said pulse bias power supply and having a pulse width shorter than the pulse bias voltage.

7. A metal ion implanting apparatus according to claim 1, further comprising means for introducing into said vacuum vessel a reactive gas reacting with evaporation substance ionized when the cathodes of said arc evaporation sources are arc-evaporated.

8. A metal ion implanting apparatus according to claim 6 further comprising means for introducing a reactive gas into said vacuum vessel, and a plurality of switches for opening/closing between the cathodes of said arc evaporation sources and said vacuum vessel.

9. A metal ion implanting apparatus according to claim 6, wherein the negative pulse-like bias voltage has an absolute value in the range of 1 kV to 700 kV, a pulse width ranging from 1 µs to 10 ms, and a frequency ranging from 100 Hz to 10 kHz.

10. A metal ion implanting apparatus according to claim 6 or 9, further comprising means for rotating said holder and the substrate held by said holder in said vacuum vessel.

11. A metal ion implanting apparatus according to claim 9, further comprising means for introducing a reactive gas into said vacuum vessel, and a plurality of switches for opening/closing between the cathodes of said arc evaporation sources and said vacuum vessel.

12. A metal ion implanting apparatus according to claim 10, further comprising means for introducing a reactive gas into said vacuum vessel, and a plurality of switches for opening/closing between the cathodes of said arc evaporation sources and said vacuum vessel.

13. A metal ion implanting apparatus according to claim 9, further comprising means for introducing into said vacuum vessel a reactive gas reacting with evaporation substance ionized when the cathodes of said arc evaporation sources are arc-evaporated.

14. A metal ion implanting apparatus according to claim 10, further comprising means for introducing into said vacuum vessel a reactive gas reacting with evaporation substance ionized when the cathodes of said arc evaporation sources are arc-evaporated.

* * * * *